United States Patent
Fujii et al.

[11] Patent Number: 5,948,550
[45] Date of Patent: *Sep. 7, 1999

[54] MAGNETORESISTIVE FILM

[75] Inventors: Shigeo Fujii; Shin Noguchi, both of Kumagaya, Japan

[73] Assignee: Hitachi Metals, Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/629,400

[22] Filed: Apr. 8, 1996

[30] Foreign Application Priority Data

Apr. 11, 1995 [JP] Japan .................................... 7-085168

[51] Int. Cl.⁶ ...................................................... B32B 15/00
[52] U.S. Cl. ........................ 428/680; 428/611; 428/928; 428/668; 428/692; 428/675
[58] Field of Search .................................... 428/611, 928, 428/668, 692, 680, 675

[56] References Cited

U.S. PATENT DOCUMENTS

| | | | |
|---|---|---|---|
| 4,103,315 | 7/1978 | Hempstead et al. ...................... | 360/110 |
| 5,168,760 | 12/1992 | Wun-Fogle et al. ....................... | 73/779 |
| 5,206,590 | 4/1993 | Dieny et al. ............................ | 324/252 |
| 5,373,238 | 12/1994 | McGuire et al. ........................ | 324/252 |
| 5,534,355 | 7/1996 | Okuno et al. ............................ | 428/611 |
| 5,569,544 | 10/1996 | Daughton ................................ | 428/611 |
| 5,595,830 | 1/1997 | Daughton ................................ | 428/611 |
| 5,658,658 | 8/1997 | Yamamoto ............................... | 428/332 |

FOREIGN PATENT DOCUMENTS 4-358310   12/1992   Japan .............................. G01R 33/02

OTHER PUBLICATIONS

R. Dimmich, *Electronic Transport Properties of Metallic Multi–Layer Films,* 1985, 27, 50–370, The Institute of Physics, Technical University of Wroclaw, Wroclaw, Poland.

*Primary Examiner*—Nam Nguyen
*Assistant Examiner*—Steven H. Ver Steeg
*Attorney, Agent, or Firm*—Staas & Halsey

[57] ABSTRACT

A magnetoresistive film having a spin valve multi-layer structure has low electrical resistance and high sensitivity. In the magnetoresistive film, an under-layer, a first ferromagnetic layer, a non-magnetic layer, a second ferromagnetic layer, and an antiferromagnetic layer are laminated on a substrate in this order. The magnetization direction of the second ferromagnetic layer is fixed by the antiferromagnetic layer, and the magnetization direction of the first ferromagnetic layer is not fixed. The average grain size of the first ferromagnetic layer ranges from 8 to 14 nm.

10 Claims, 5 Drawing Sheets

MAGNETORESISTIVE FILM

BACKGROUND OF THE INVENTION

1. Field of the Invention

The present invention relates to a magnetoresistive film used for a magnetic sensor, which detects a magnetic signal from a magnetic recording medium and converts it to electrical information, especially for a read-only magnetic head of a hard disk unit, magnetoresistive sensor element, and the like.

2. Description of the Related Art

Hitherto, a magnetic head has been used as a means for converting an electric signal to a magnetic signal, recording it as information on a magnetic recording medium, and reproducing the magnetic information in the form of the electric signal. To record information, such a magnetic head generates a magnetic field by exciting a ferromagnetic material, which has high permeability, by energizing a coil so as to magnetize a magnetic recording medium for recording. To reproduce the information, the magnetic head detects, as a signal, a voltage generated in a coil by a magnetic flux flowing through the ferromagnetic material due to the magnetic field generated from the magnetic recording medium. This type of magnetic head is called an inductive head which is typically represented by a metal-in-gap ferrite head and a thin-film head which uses a magnetic thin film.

The reproduction sensitivity of these inductive heads decreases with decreasing magnitude of the magnetic field generated from a magnetic recording medium. Hence, it is considered that the inductive heads will be no longer good in a case where the recording density increases and the recording bit, which is the unit of magnetic information formed on a magnetic recording medium, decreases with a resultant reduced leakage magnetic field generated by the bit. To cope with this difficulty, a magnetoresistive head with higher reproduction sensitivity has recently become used for the reproducing section of a magnetic head.

For the magnetoresistive head, a Ni—Fe type Permalloy ferromagnetic film, the electrical resistance of which changes as magnetic field changes, is used; it is expected to provide reproduction sensitivity which is at least three times that of the inductive heads. This head, however, makes use of the characteristic of the Permalloy film in which the electrical resistance changes in dependence on the magnetization direction of the Permalloy film; therefore, magnetoresistance ratio, which is the index of reproduction sensitivity, is only 2% at the most. Recently, there has been proposed a spin valve multi-layer film which has multiple layers as shown in FIG. 5 and which makes use of the scattering occurring at the interfaces defined between the layers (Japanese Patent Laid-Open No. 4-358310). The spin valve multi-layer film provides the magnetoresistance ratio which is several times higher than that of the conventional Permalloy element.

The aforesaid multi-layer film is formed of a second ferromagnetic layer, the magnetization direction of which is fixed by an antiferromagnetic layer, and a first ferromagnetic layer which is separated from the second ferromagnetic layer by a non-magnetic layer. The magnetization direction of the second ferromagnetic layer is fixed by a unidirectional anisotropy field caused by the exchange coupling between the antiferromagnetic layer and the second ferromagnetic layer; weak ferromagnetic coupling occurs between the second ferromagnetic layer and the first ferromagnetic layer having the unfixed magnetization direction, both of which first and second ferromagnetic layers are separated from each other by the non-magnetic layer. The ferromagnetic layer with the unfixed magnetization direction is magnetically turned to the direction of the applied magnetic field by applying small magnetic field ($H_1$), whereas larger applied magnetic field ($H_2$) is required to magnetically turn the second ferromagnetic layer with the fixed magnetization direction. The electrical resistance is smaller when two ferromagnetic layers are in the same magnetization direction; the electrical resistance increases in a magnetic field which is larger than $H_1$ but smaller than $H_2$ and when the magnetization directions of the two layers are antiparallel.

In a case where the magnetoresistive element is used as a magnetic sensor, the magnetic sensor acts to detect a magnetic field which is less than $H_2$ and the polarity of which switches. For making this possible, the ferromagnetic layer with the unfixed magnetization direction is required to exhibit good soft magnetic characteristic typically represented by a small coercive force, and the ferromagnetic layer with the fixed magnetization direction is required to exhibit a large unidirectional anisotropy field brought about by the antiferromagnetic layer and not to be sensitive to a leakage magnetic field from a recording bit.

On the other hand, the multi-layer structure is known to generally exhibit higher electrical resistance than that in a single-layer (J. Phys. F, Met.Phys., 15(1985) No. 2477). In a practically used magnetic sensor element such as a magnetic head, a certain level of extremely small electric current is made to flow therethrough, whereas in the films constituting the element, an electric current having a high current density of approximately $10^7 A/cm^2$ is made to constantly flow therethrough. Hence, the high electrical resistance of the multi-layer structure causes the element to generate more heat, leading to deterioration in performance including more electrical noises due to thermal disturbance.

Hence, there has been a demand for a magnetoresistive element having both a lower electrical resistance of the film and a greater magnetoresistance effect (that is, a greater magnetoresistance ratio which is the performance indicator for the element) even in a case where the magnetoresistive element is formed of materials similar to those of conventional elements.

SUMMARY OF THE INVENTION

Accordingly, it is an object of the present invention to provide a magnetoresistive element having a low electrical resistance and high sensitivity both of which are achieved in a multi-layer film.

To this end, according to the present invention, there is provided a magnetoresistive film formed of a multi-layer film comprising: a substrate; an under-layer formed on the substrate, a first ferromagnetic layer formed on the under-layer, a non-magnetic layer formed on the first layer, a second ferromagnetic layer formed on the non-magnetic layer, and an antiferromagnetic layer formed on the second layer, said second ferromagnetic layer being provided with a magnetization direction fixed by the antiferromagnetic layer, said first ferromagnetic layer being provided with a magnetization direction which is not fixed and being provided with an average grain size of from 8 to 14 nm, and the antiferromagnetic layer being provided with a thickness ranging from 4 to 8 nm.

According to one aspect of the invention, the first ferromagnetic layer is provided with a grain size which minimizes a coercive force and which maximizes a magnetoresistance ratio. Also, each of the first ferromagnetic layer and the second ferromagnetic layer is provided with a grain size ensuring a good epitaxial relationship so that an adequate unidirectional anisotropy field is generated. The multi-layer film may extend in a plane direction, with the magnetoresistive film including an electrode for causing electric current to flow in the plane direction of the film so that the electric current intersects with the fixed magnetization direction of said second ferromagnetic layer. In this case, the magnetoresistive film may be used for a magnetic sensor element for detecting a change in electrical resistance caused by a rotational difference of magnetization between said first ferromagnetic layer and said second ferromagnetic layer.

The inventors of the present invention have discovered that the electrical resistance of a multi-layer film and the sensitivity of magnetoresistance effect thereof are closely related to the grain size of the material constituting the film. In a single-layer film, since the scattering due to crystal grain boundaries exerts significant influences, the electrical resistance decreases as the grain size increases. In a multi-layer film formed of laminated multiple thin layers, the electrical resistance depends on the number of laminated layers in a case where there is no significant difference in electrical resistance among the layers. In another case where a crystallographic epitaxy (two-dimensional crystal orientation) relationship exists among the respective layers of the multi-layer structure, the electrical resistance thereof greatly depends on the grain size even in the multi-layer film. More specifically, in the multi-layer film formed of an amorphous metal under-layer, a first ferromagnetic layer, a non-ferromagnetic layer, a second ferromagnetic layer, and an antiferromagnetic layer all of which layers are laminated on a substrate in this order, the average grain size depends on the average grain size of the first ferromagnetic layer, and the grain size of other layers laminated thereon in turn becomes similar to that of the first ferromagnetic layer. The electrical resistance decreases as the grain size increases, and becomes nearly a constant value in a case of a grain size of 14 nm or more.

For obtaining high sensitivity of magnetoresistance effect, it is required that, in the multi-layer film, the first ferromagnetic layer with the unfixed magnetization direction exhibits good soft magnetic properties and that the second ferromagnetic layer with the fixed magnetization direction has a great unidirectional anisotropy field brought about from the antiferromagnetic layer. In a case where crystal grain size increases in the film, the local magnetic anisotropy is increased, resulting in deteriorated soft magnetic characteristics.

In the multi-layer film according to the present invention, a grain size of 14 nm or more is not desirable because the coercive force, which is the indicator of the soft magnetic properties, increases. On the other hand, the coercive force also increases in a case where the grain size is too small, namely, 8 nm or less. It is preferable that the first ferromagnetic layer is formed of a metal of Ni—Fe alloy or Ni—Fe—Co alloy material of a face-centered cubic structure containing Ni as a main constituent which metal has good soft magnetic properties and which metal has small uniaxial anisotropy field of 0.8 kA/m or less which anisotropy is induced when forming the film under a magnetic field applied in one direction.

Further, for achieving a large unidirectional anisotropy field with respect to the second ferromagnetic layer with the fixed magnetization direction, it is required that the epitaxial relationship be established for the crystal growth of both the second ferromagnetic layer and the antiferromagnetic layer and that good conformation can be accomplished between the crystal lattices of the two layers. These relationships are closely related with the grain size. More specifically, if the grain size is small, then the crystal lattices are considerably distorted and the epitaxial relationship decreases, and an adequate unidirectional anisotropy field does not occur.

For the reason mentioned above, in the invention the grain size is required to be 8 nm or more. The adequate unidirectional anisotropy field herein is 16 kA/m or more. To induce the unidirectional anisotropy field, the antiferromagnetic layer must be formed to have a film thickness of 4 nm or more because no adequate unidirectional anisotropy field can be obtained if the thickness is less than 4 nm. On the other hand, if the antiferromagnetic layer is too thick, the electrical resistance of the multi-layer film increases (because the antiferromagnetic layer has a high electrical resistance) with the result that a resultant lower magnetoresistance ratio occurs, although the adequate unidirectional anisotropy field can be obtained. Hence, from the viewpoint of the magnetoresistance ratio, the film thickness is preferably 8 nm or less.

The second ferromagnetic layer with the fixed magnetization direction is preferably formed of pure Co or a Co-based alloy such as Co—Ni, Co—Fe, or Co—Fe—Ni type alloy which provides great magnetic scattering at the interface defined between the second ferromagnetic layer and the non-magnetic layer and which is therefore expected to provide great magnetoresistance effect. The use of Co or such an alloy ensures great magnetoresistance effect. In the present invention, in order to obtain the characteristics, it is necessary to arrange the magnetization directions of the two ferromagnetic layers in parallel or antiparallel to an external magnetic field. Moreover, in order to fix the magnetization direction, it is necessary to apply a magnetic field to a substrate in a fixed direction during the film producing process by use of permanent magnet and etc. The intensity of the magnetic field is 2 kA/m or more.

In the multi-layer film in accordance with the present invention, the epitaxial relationship must be established between the first ferromagnetic layer, the non-magnetic layer, and the second ferromagnetic layer which are laminated on the under-layer. For achieving this relationship, the non-magnetic layer and the second ferromagnetic layer which is formed in succession after the forming of the first ferromagnetic layer must have the same face centered cubic structure as that of the first ferromagnetic layer. By establishing the aforesaid relationship, an approximately same average grain size is obtained. Accordingly, in the invention, the first ferromagnetic layer must have an average grain size of 8 to 14 nm to meet the characteristics required in both the first ferromagnetic layer and the second ferromagnetic layer.

The second ferromagnetic layer formed of Co or a Co-based alloy has 5 nm thick or less in order to have the face centered cubic crystal structure. A thickness exceeding 5 nm changes the crystal structure to a hexagonal closed-packed structure and impairs the epitaxial relationship. As a result, no unidirectional anisotropy field is generated and no influence of the first ferromagnetic layer occurs on the crystal grain size thereof. In the face centered cubic structure, it is preferable that crystal plane (111) is preferentially oriented with respect to the film surface. This enables the first ferromagnetic layer to have good soft magnetic properties and it brings about a linear change of the specific resistance with respect to magnetic field, thus providing an advantage in the use for a magnetic head.

The sensitivity of magnetoresistance effect is effectively improved by forming the following layers, that is, the second antiferromagnetic layer, the third ferromagnetic layer with a fixed magnetization direction, and the second non-magnetic layer, all of which layers are arranged in this order between the under layer and the first ferromagnetic layer so that the interfaces between each non-magnetic layer and each of the two ferromagnetic layers may increase to enhance magnetic scattering effect of conduction electrons. The increasing of the interfaces, however, causes a decreased unidirectional anisotropy field of the ferromagnetic layers which magnetic field is induced by the antiferromagnetic layer and weakens the fixation of the magnetization direction in relation to an external magnetic field, resulting in lower sensitivity. In addition, the increase of the number of the layer in excess of necessary layers causes increase of electrical resistance of the multi-layer film. Hence, the adding of interfaces more than necessary number is not desirable for the element in practical applications.

The non-magnetic metal layer, which separates the two ferromagnetic layers exhibits the maximum sensitivity when it is Cu; however, it may be Au or Ag or an alloy which contains at least one of them. The thickness of the layer is preferably 4 nm or less so that the weak ferromagnetic coupling occurs between the two ferromagnetic layers. If the connection is too strong, the first ferromagnetic layer cannot quickly react to an external magnetic field; therefore, the layer is preferably 1 nm thick or more. The intensity of the connection is confirmed by measuring magnetic field $H_1$ which serves as the aforesaid indicator. In this invention, $H_1$ is 1.6 kA/m or less, which value corresponds to the value of the magnetic field at which the maximum change in electrical resistance is obtained under the application of magnetic field.

The under-layer is used to improve the crystallization of the first ferromagnetic layer which is formed on the under-layer. For this purpose, a metal material such as Ta and Hf is preferably used for the under-layer because this material can be formed to have amorphousness and good flatness, and because this material has a high electrical resistance which allows electric currents to flow between the first and second ferromagnetic layers which provide the magnetoresistance effect. These metals turn to crystalline as the thickness thereof increases and deteriorate both the crystal orientation and the soft magnetic characteristics of the ferromagnetic layers. Accordingly, the thickness of the metal for the under-layer is preferably 8 nm or less.

The grain size explained in the invention is measured by the X-ray diffraction method or by an observing means such as an electron microscope. To evaluate the grain size by the X-ray diffraction method, a detecting device is used which determines the diffraction intensity by interrelating both the light receiving surface of a specimen and a diffracted light-receiving section with respect to the radiation source. The grain size is calculated from the half breadth of the diffraction intensity of (111) plane which intensity is expected regarding the first ferromagnetic layer, at a scanning speed of 0.5 deg/min or less. When using the electron microscope to measure the grain size, the cross section of the multi-layer film is machined while using an ion milling or other similar means until it allows an electron beam to pass through it. The view under the electron microscope is enlarged until the lattice stripes of the crystal lattices of the first ferromagnetic layer can be recognized. The grain size is determined from the boundary from which the continuity of a single lattice stripe is no longer observed.

The electrical resistance of the multi-layer film in accordance with the present invention is measured by the four-terminal method; the magnetoresistance effect is determined from the change in the electrical resistance in relation to an applied magnetic field while applying a uniform magnetic field through Helmholtz coils or the like. The magnetic field applied may be either DC or AC. Other methods than the four-terminal method may be used for measuring the electrical resistance as long as it makes a constant current pass through the specimen and detects the generated voltage.

BRIEF DESCRIPTION OF THE DRAWINGS

FIGS. 5a to 5d show the structural examples of a multi-layer film in accordance with the present invention, wherein FIG. 5a shows a multi-layer film which includes a first ferromagnetic layer and a second ferromagnetic layer; FIG. 5b shows a multi-layer film which includes a first ferromagnetic layer, a second ferromagnetic layer, and a third ferromagnetic layer; FIG. 5c shows a multi-layer film which includes two ferromagnetic layers with fixed magnetization directions and two ferromagnetic layers with unfixed magnetization directions; and FIG. 5d shows a multi-layer film which includes two ferromagnetic layers with fixed magnetization directions and three ferromagnetic layers with unfixed magnetization directions.

DESCRIPTION OF THE PREFERRED EMBODIMENTS

The characteristics of the present invention will now be described according to embodiments.

First Embodiment

An experiment was conducted at vacuum of $5 \times 10^{-5}$ Pa or less by using an ion beam sputtering apparatus which had a commonwealth type ion gun and in which apparatus an intended target material was installed in the same vacuum tank. An Ar gas was introduced into the ion gun to form a Ta under-layer having a thickness of 5 nm on a glass substrate, which substrate had permanent magnets on both sides thereof so that a magnetic field of 4 kA/m was applied in one direction, under an Ar pressure of $4 \times 10^{-2}$ Pa, at an ion current of 6 mA, and under an accelerating voltage of 1200 V. In the next step, a ferromagnetic layer composed of $Ni_{81}Fe_{19}$ (atomic percentage) was formed to have a thickness of 5 nm at an ion current of 6 mA and an accelerating voltage of 300 to 1500 V. Then, a Cu layer was formed to have a thickness of 2 nm and a Co layer of a thickness of 4 nm under the same layer-forming conditions as those for the Ta layer. Further, an $Fe_{50}Mn_{50}$ (atomic percentage) alloy antiferromagnetic layer was formed to have a thickness of 5 nm to complete a multi-layer film.

Figures 1A, 1B:
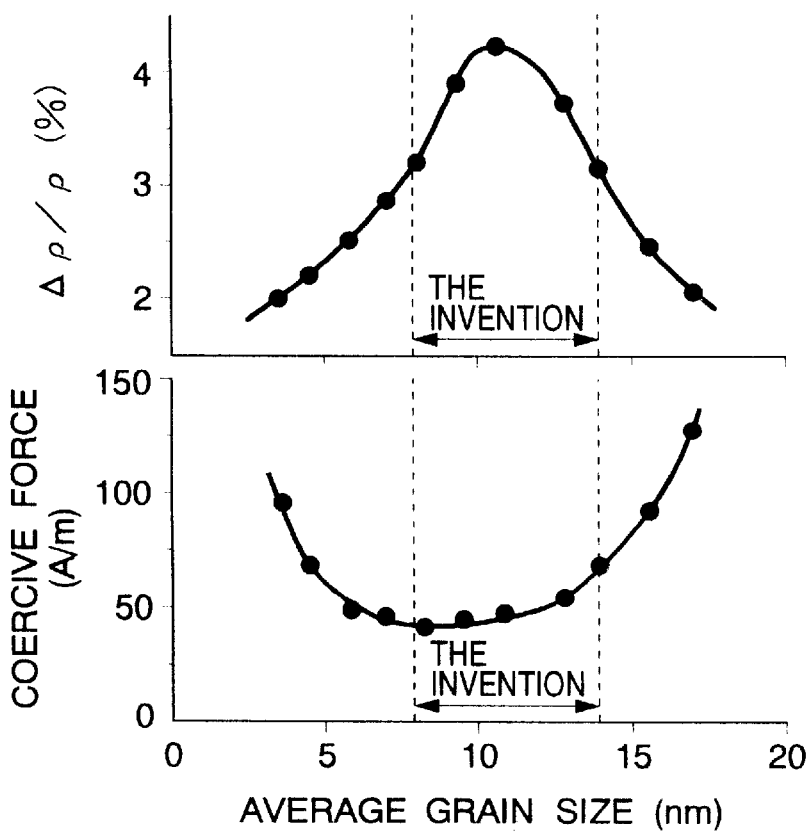
FIGS. 1a and 1b show the relationship between the magnetoresistance ratio and coercive force with respective to average grain size.
Figure 2A:
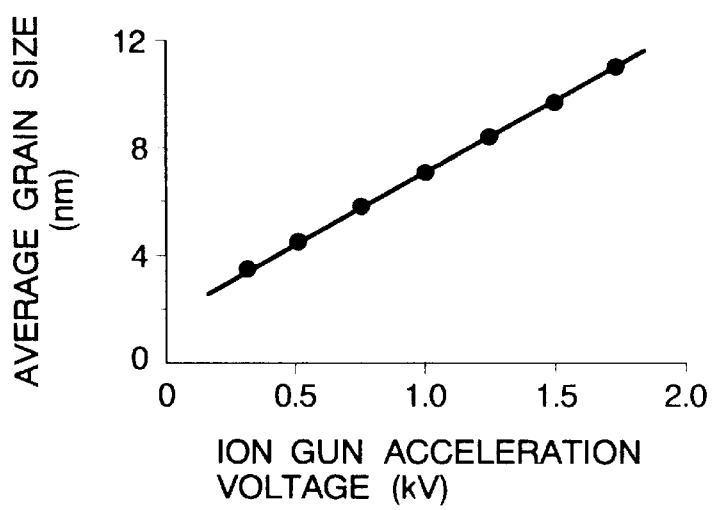
FIGS. 2a and 2b show the relationship between the accelerating voltage of an ion gun and a sub ion gun and average grain size.
Figure 2B:
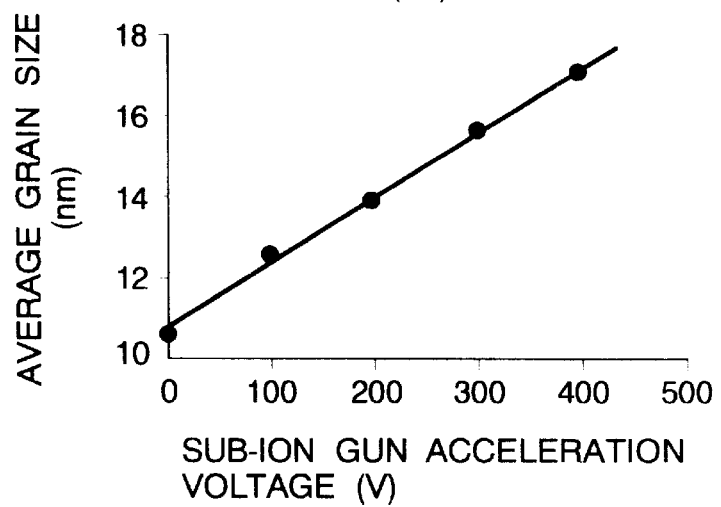

The temperature of the substrate was maintained at about room temperature by water-cooling the bottom of the substrate during the film forming process. A diffraction measuring apparatus designed to excite a Cu beam source at a current of 250 mA and a voltage of 50 kV to generate X rays was used to determine the average grain size of the produced film specimen. A half breadth was determined from a diffraction peak profile attributed to (111) of the Ni—Fe layer which was measured at a scanning speed of 0.2 deg/min., then the average grain size was calculated according to the Seherrer's formula. The relationship between the accelerating voltage and the average grain size is shown in FIG. 2a. FIG. 2b shows the relationship between the average grain size of the Ni—Fe layer and the sub ion gun accelerating voltage when the film was produced while radiating ions by the sub ion gun at an accelerating voltage of 1.5 kV. FIG. 1a and FIG. 1b respectively show the dependence of the magnetoresistance ratio ($\Delta\rho/\rho$) and of the coercive force of the first ferromagnetic layer on the average grain size observed when the magnetic field was applied to the specimen. The magnetoresistance ratio was measured while using the four-terminal method by applying an AC magnetic field of 4 kV/m, 50 Hz to the film surfaces of the specimen and by supplying a current of 5 mA.

Second Embodiment

Figure 3:
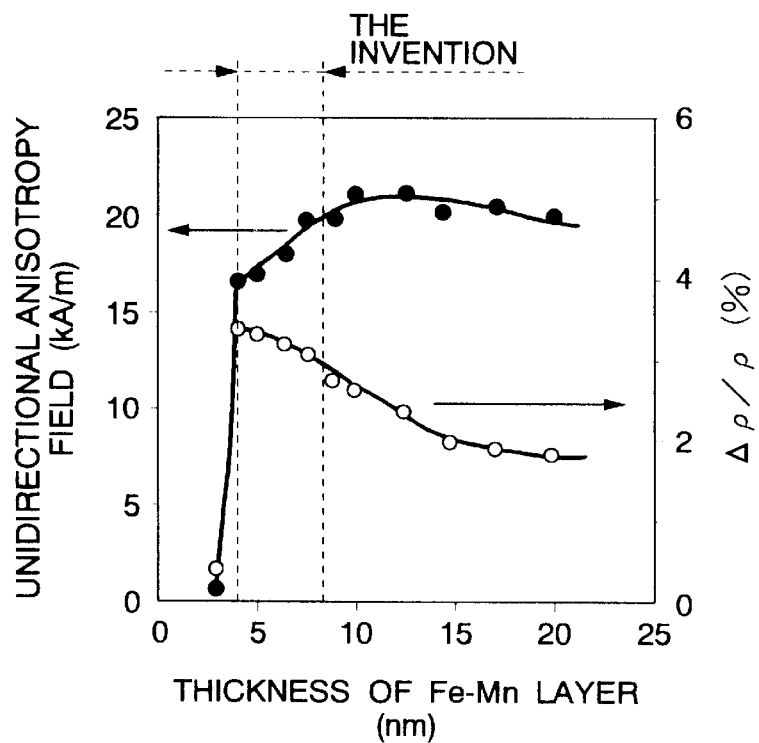
FIG. 3 shows the magnitude of the unidirectional anisotropy field and the magnetoresistance ratio in relation to the thickness of a Fe—Mn layer.

A Ta under-film was formed to have a thickness of 5 nm, a $Ni_{80}Fe_{20}$ (atomic percentage) ferromagnetic film was formed to have a thickness of 8 nm, a Cu film was formed to have a thickness of 2 nm, and a Co film was formed to have a thickness of 3 nm, all of which layers were arranged in this order, on and above an alumina titanium carbide substrate on which a thin alumina film of 3 μm thickness had been previously formed at an ion current of 6 mA and an accelerating voltage of 1200 V. Further, under the same conditions, an $Fe_{50}Mn_{50}$ antiferromagnetic film was formed to have a thickness of 3 to 20 nm. The rest of the film producing conditions was the same as that of the first embodiment. FIG. 3 shows the magnitude of the unidirectional anisotropy field with the second ferromagnetic layer, which was determined using a vibrating sample magnetometer, and the magnetoresistance ratio ($\Delta\rho/\rho$) in relation to the thickness of the Fe—Mn film.

Third Embodiment

Figure 4:
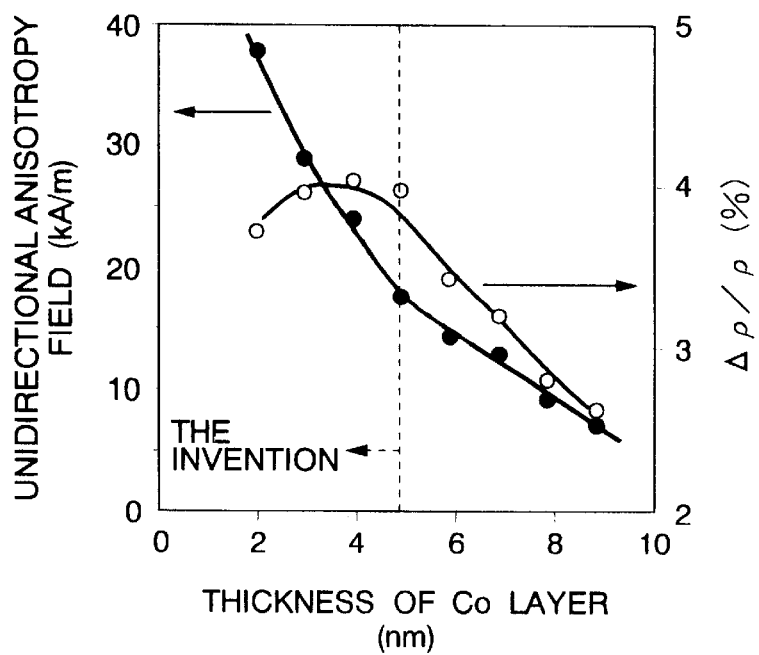
FIG. 4 shows the unidirectional anisotropy field with the second ferromagnetic layer and the magnetoresistance ratio in relation to the thickness of a Co layer.

A multi-layer film was produced under the same conditions as those of the second embodiment except that the substrate was a monocrystalline Si, the first ferromagnetic layer was $Ni_{66}Fe_{16}Co_{18}$ (atomic percentage), the Co layer was 1 to 10 nm thick, and the $Ni_{50}Mn_{50}$ (atomic percentage) layer was 5 nm thick. After that, the specimen was subjected to 5-hour heat treatment at 300° C. while applying a DC magnetic field of 80 kA/m in the same direction as that for the film forming process in a vacuum tank adjusted to have a vacuum degree of $4\times10^{-3}$ Pa or less. FIG. 4 shows the magnitude of the unidirectional anisotropy field with the second ferromagnetic layer in relation to the thickness of the Co layer and the magnetoresistance ratio ($\Delta\rho/\rho$) in a 50-Hz AC magnetic field in the applied magnetic field of 4 kA/m.

Fourth Embodiment

Figure 5A:
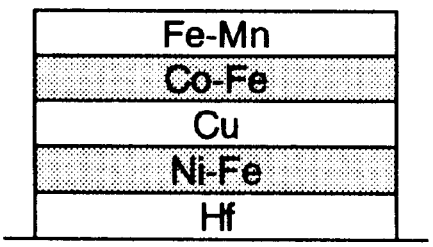
Figure 5B:
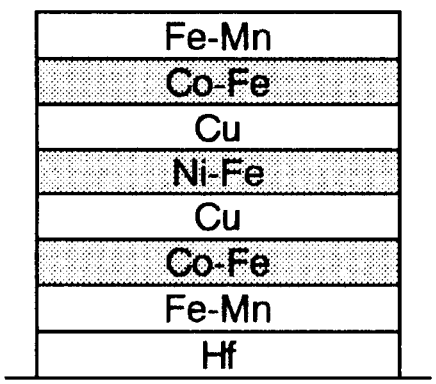
Figures 6A, 6B:
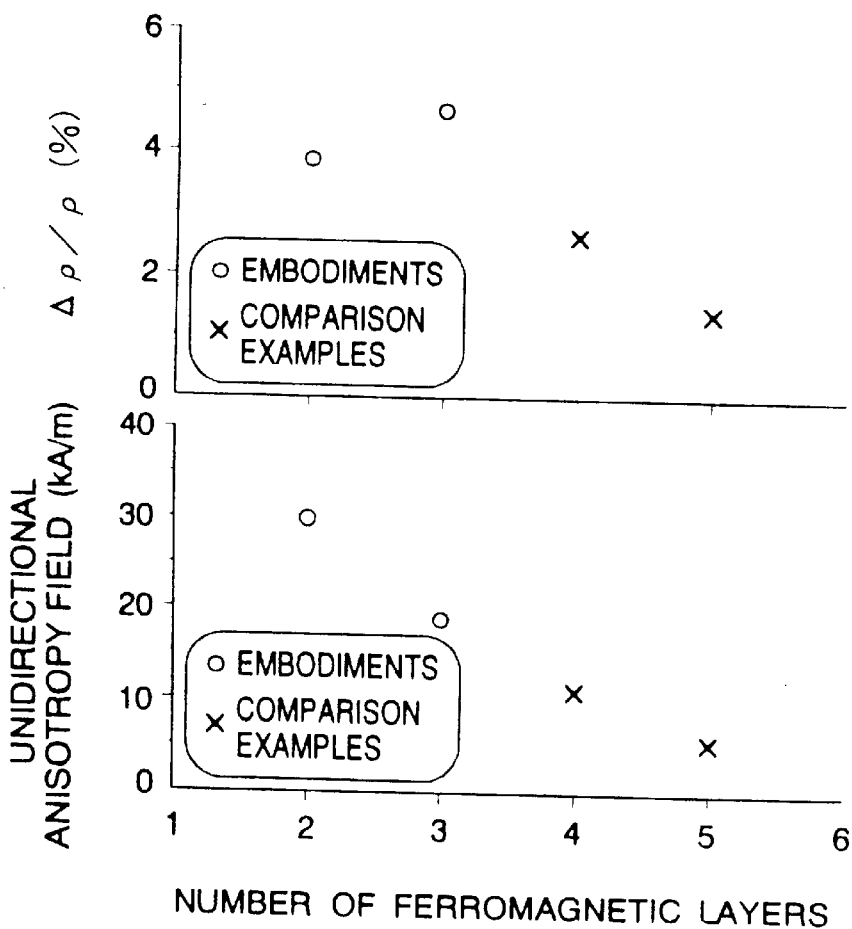
FIG. 6 shows the unidirectional anisotropy field and the magnetoresistance ratio in relation to the number of ferromagnetic layers.

Under the same film forming conditions as those of the second embodiment, the Hf under-layer was formed to have a thickness of 5 nm, the $Ni_{81}Fe_{19}$ (atomic percentage) layer being formed to have a thickness of 5 nm, the Cu layer being formed to have a thickness of 1.5 nm, the $Co_{90}Fe_{10}$ layer being formed to have a thickness of 4 nm, and the $Fe_{50}Mn_{50}$ (atomic percentage) layer was formed to have a thickness of 5 nm, all of which layers were arranged in this order. Then, after forming the Hf under-layer, the Fe—Mn layer, the Co—Ni layer, and the Cu layer were respectively formed to have the thicknesses given above. After that, the Ni—Fe layer, the Cu layer, the Co—Fe layer, and the Fe—Mn layer were formed in the similar manner. FIG. 5a and FIG. 5b show the structures of the produced multi-layer films. FIG. 6 shows the magnitude of the unidirectional anisotropy field of Ni—Fe and Co—Fe in relation to the total number of the first and second ferromagnetic layers and the magnetoresistance ratio ($\Delta\rho/\rho$) in the 50-Hz AC magnetic field in the applied magnetic field of 4 kA/m.

Example for Comparison

Figure 5C:
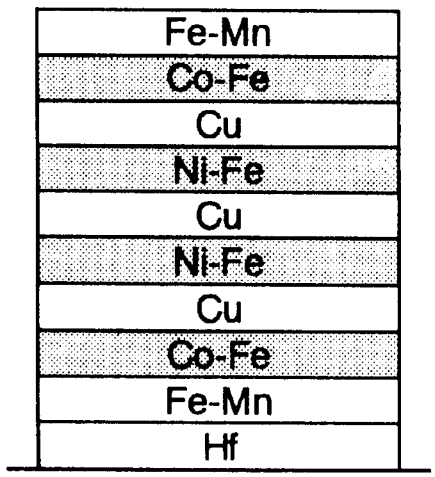
Figure 5D:
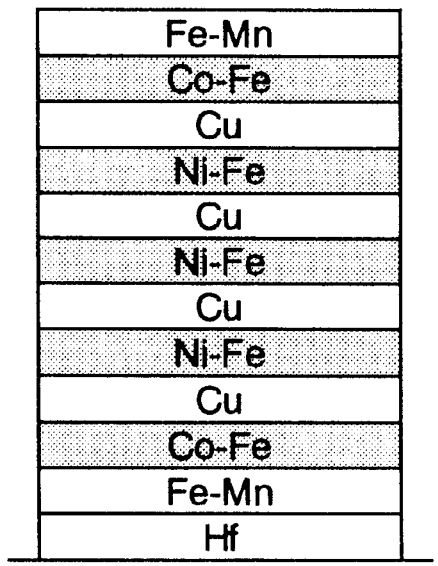

According to the same procedure as that used for the fourth embodiment, the Hf under-layer was formed to have a thickness of 5 nm, the $Fe_{50}Mn_{50}$ (atomic percentage) layer being formed to have a thickness of 5 nm, the $Co_{90}Fe_{10}$ layer being formed to have a thickness of 4 nm, the Cu layer being formed to have a thickness of 1.5 nm, and the $Ni_{81}Fe_{19}$ (atomic percentage) layer was formed to have a thickness of 5 nm, all of which layers are arranged in this order. Further, the Cu layer was formed to have a thickness of 1.5 nm, and the $Ni_{81}Fe_{19}$ (atomic percentage) layer was formed to have a thickness of 5 nm, then the Cu layer being formed to have 1.5 nm, and the Co—Fe layer and the Fe—Mn layer of the aforesaid compositions were added thereon. Then, the Hf under-layer of 5 nm thick, the Fe—Mn layer of 5 nm thick of the aforesaid composition, the Co—Fe layer of 4 nm thick, the Cu layer of 1.5 nm thick, the Ni—Fe layer of 5 nm thick, the Cu layer of 1.5 nm thick, the Ni—Fe layer of 5 nm thick, the Cu layer of 1.5 nm thick, the Ni—Fe layer of 5 nm thick, the Cu layer of 1.5 nm thick, the Co—Fe layer of 4 nm thick, and the Fe—Mn layer of 5 nm thick were formed in this order. FIG. 5c and FIG. 5d show the structures of the produced multi-layer films. Thus, the total numbers of ferromagnetic layers composed of Ni—Fe and Co—Fe of the produced multi-layer films are four and five, respectively. FIG. 6 shows the magnitude of the unidirectional anisotropy field in relation to the number of the ferromagnetic layers and the magnetoresistance ratio ($\Delta\rho/\rho$) in the 50-Hz AC magnetic field in the applied magnetic field of 4 kA/m.

As it can be seen from FIG. 1a and FIG. 1b, as long as the grain size of the first ferromagnetic layer with the unfixed magnetization direction stays in the range of 8 to 14 nm as in the present invention, high magnetoresistance ratios and low coercive forces are observed. Moreover, FIG. 3 shows that the effect of the antiferromagnetic layer can be fully exhibited when the thickness of the antiferromagnetic layer, which fixes the magnetization of the second ferromagnetic layer composed of Co base, is 4 nm or more. If, however, the thickness exceeds 8 nm, then the electrical resistance of the whole film increases and the magnetoresistance ratio ($\Delta\rho/\rho$) with respect to the magnetic field accordingly drops.

It is obvious from FIG. 4 that the thickness of the second ferromagnetic layer composed of Co base must be 5 nm or less to ensure that the unidirectional anisotropy field is 16 kA/m or more and that the magnetoresistance effect occurs. In addition, FIG. 6 indicates that the increasing of the number of the Co-based and Ni-based ferromagnetic layers with non-magnetic layers located between them in excess of a predetermined number causes an undesirable significant decrease in the magnetoresistance ratio and also in the unidirectional anisotropy field.

In this embodiment, the ion beam sputtering apparatus was used and the film forming conditions including the accelerating voltage, the temperature of the substrate, and ion assist were changed to control the grain size. It is obvious, however, that other film forming conditions may be changed or other film forming method than the ion beam sputtering method may be employed to obtain the same advantage.

What is claimed is:

1. A magnetoresistive film formed of a multi-layer film extending in a film plane, comprising:

a substrate, an under-layer formed on the substrate, a first ferromagnetic layer formed on the under-layer, a non-magnetic layer formed on the first ferromagnetic layer, a second ferromagnetic layer formed on the non-magnetic layer, and an antiferromagnetic layer formed on the second ferromagnetic layer, each of said ferromagnetic layers being provided with a magnetization direction in the film plane, said magnetization direction of said second ferromagnetic layer being fixed by a unidirectional anisotropy field brought about by said antiferromagnetic layer, said magnetization direction of said first ferromagnetic layer not being fixed, and said first ferromagnetic layer having an average grain size measured in a direction extending in the film plane of from 8 to 14 nm.

2. A magnetoresistive film according to claim 1, wherein the film thickness of said antiferromagnetic layer ranges from 4 to 8 nm.

3. A magnetoresistive film according to claim 2, wherein said second ferromagnetic layer has a film thickness of 5 nm or less and is formed of Co or a Co-based alloy.

4. A magnetoresistive film according to claim 1, wherein said second ferromagnetic layer has a film thickness of 5 nm or less and is formed of Co or a Co-based alloy.

5. A magnetoresistive film according of claim 1, wherein said first ferromagnetic layer is formed of a Ni-based alloy.

6. A magnetoresistive film according to claim 1, wherein said second ferromagnetic layer of said multi-layer film has an average grain size of 8 to 14 nm and said antiferromagnetic layer has a film thickness of 4 to 8 nm.

7. A magnetoresistive film according to claim 1, wherein the ferromagnetic layers of said multi-layer film have crystals with a face centered cubic structure.

8. A magnetoresistive film according to claim 1, further comprising a second antiferromagnetic layer, a third ferromagnetic layer, and a second non-magnetic layer laminated between said under-layer and said first ferromagnetic layer, said third ferromagnetic layer having a magnetization direction fixed by said second antiferromagnetic layer.

9. A magnetoresistive film formed of a multi-layer film extending in a film plane comprising:

a substrate, an under-layer formed on the substrate, a first ferromagnetic layer formed on the under-layer, a non-magnetic layer formed on the first ferromagnetic layer, a second ferromagnetic layer formed on the non-magnetic layer, and an antiferromagnetic layer formed on the second ferromagnetic layer, said first ferromagnetic layer being provided with a magnetization direction which is not fixed, said first ferromagnetic layer being provided with a grain size which minimizes a coercive force, and each of said first ferromagnetic layer and said second ferromagnetic layer having a grain size measured in a direction extending in the film plane of from 8 to 14 nm ensuring a good epitaxial relationship so that an adequate unidirectional anisotropy field is generated.

10. A magnetoresistive film according to claim 9, wherein the multi-layer film extends in a plane direction, the magnetoresistive film further comprising an electrode for causing electric current to flow in the plane direction of the film so that the electric current intersects with the fixed magnetization direction of said second ferromagnetic layer, said magnetoresistive film being used for a magnetic sensor element for detecting a change in electrical resistance caused by a rotational difference of magnetization between said first ferromagnetic layer and said second ferromagnetic layer.

* * * * *